United States Patent [19]
Angelotti et al.

[11] Patent Number: 5,717,701
[45] Date of Patent: Feb. 10, 1998

[54] APPARATUS AND METHOD FOR TESTING INTERCONNECTIONS BETWEEN SEMICONDUCTOR DEVICES

[75] Inventors: Frank William Angelotti; Steven Michael Douskey, both of Rochester, Minn.

[73] Assignee: International Business Machines Corporation, Armonk, N.Y.

[21] Appl. No.: 702,414

[22] Filed: Aug. 13, 1996

[51] Int. Cl.⁶ .................................................. G01R 31/28
[52] U.S. Cl. ........................................ 371/22.3; 395/183.06
[58] Field of Search ................................ 324/73 R, 158 R; 371/22.1, 22.3, 22.4; 395/183.06

[56] References Cited

U.S. PATENT DOCUMENTS

| | | | |
|---|---|---|---|
| 4,441,075 | 4/1984 | McMahon | 324/73 R |
| 5,029,166 | 7/1991 | Jarwala et al. | 371/22.1 |
| 5,103,450 | 4/1992 | Whetsel | 371/22.1 |
| 5,202,625 | 4/1993 | Farwell | 324/158 R |
| 5,321,277 | 6/1994 | Sparks et al. | 257/48 |
| 5,416,409 | 5/1995 | Hunter | 324/158.1 |
| 5,423,050 | 6/1995 | Taylor et al. | 395/575 |
| 5,444,715 | 8/1995 | Gruetzner et al. | 371/22.3 |
| 5,473,617 | 12/1995 | Farwell | 371/22.3 |
| 5,535,331 | 7/1996 | Swobodz et al. | 395/183.21 |

OTHER PUBLICATIONS

Chan, J.C., et al, "Boundary Walking Sequences for Circuit Board Interconnect Test", *IBM Technical Disclosure Bulletin*, vol. 36 No. 11, Nov. 1993, pp. 19–22.

*Primary Examiner*—Vincent P. Canney
*Attorney, Agent, or Firm*—Schmeiser, Olsen & Watts

[57] ABSTRACT

A boundary scan register allows for simplified testing of interconnections between integrated circuits. The interconnections between integrated circuits are characterized according to net type. Each net type has one or more mask registers that drive control inputs to each boundary scan register that drives a net of that type. One integrated circuit is configured to drive, while the others are configured to receive. The boundary scan registers are initialized to predetermined values, the mask registers are loaded, and clocks are pulsed to perform the needed tests. The results are then scanned out of the boundary scan registers, and a compression circuit compresses the test results data.

22 Claims, 10 Drawing Sheets

Device #1 Drives

Device #1
| A | C | D | F |
|---|---|---|---|
| 0 | 0 | 0 | 0 |
| 1 | 1 | 1 | 0 |

Receiver
Enable

Device #2
| A | B | D | E |
|---|---|---|---|
| 1 | 0 | 1 | 0 |
| 1 | 1 | 1 | 1 |

Device #3
| B | C | D | G |
|---|---|---|---|
| 0 | 1 | 1 | 0 |
| 1 | 1 | 1 | 1 |

Device #2 Drives

Device #1
| A | C | D | F |
|---|---|---|---|
| 1 | 0 | 1 | 0 |
| 1 | 1 | 1 | 1 |

Device #2
| A | B | D | E |
|---|---|---|---|
| 0 | 0 | 0 | 0 |
| 1 | 1 | 1 | 0 |

Device #3
| B | C | D | G |
|---|---|---|---|
| 1 | 0 | 1 | 0 |
| 1 | 1 | 1 | 1 |

Device #3 Drives

Device #1
| A | C | D | F |
|---|---|---|---|
| 0 | 1 | 1 | 0 |
| 1 | 1 | 1 | 1 |

Device #2
| A | B | D | E |
|---|---|---|---|
| 0 | 1 | 1 | 0 |
| 1 | 1 | 1 | 1 |

Device #3
| B | C | D | G |
|---|---|---|---|
| 0 | 0 | 0 | 0 |
| 1 | 1 | 1 | 0 |

FIG. 9

Device #1 Drives

Device #1
| A | C | D | F |
|---|---|---|---|
| 0 | 0 | 0 | 0 |
| 0 | 0 | 0 | 1 |

Device #2
| A | B | D | E |
|---|---|---|---|
| 1 | 0 | 1 | 0 |
| 0 | 0 | 0 | 0 |

Device #3
| B | C | D | G |
|---|---|---|---|
| 0 | 1 | 1 | 0 |
| 0 | 0 | 0 | 0 |

Device #2 Drives

Device #1
| A | C | D | F |
|---|---|---|---|
| 1 | 0 | 1 | 0 |
| 0 | 0 | 0 | 0 |

Device #2
| A | B | D | E |
|---|---|---|---|
| 0 | 0 | 0 | 0 |
| 0 | 0 | 0 | 1 |

Device #3
| B | C | D | G |
|---|---|---|---|
| 1 | 0 | 1 | 0 |
| 0 | 0 | 0 | 0 |

Device #3 Drives

Device #1
| A | C | D | F |
|---|---|---|---|
| 0 | 1 | 1 | 0 |
| 0 | 0 | 0 | 0 |

Device #2
| A | B | D | E |
|---|---|---|---|
| 0 | 1 | 1 | 0 |
| 0 | 0 | 0 | 0 |

Device #3
| B | C | D | G |
|---|---|---|---|
| 0 | 0 | 0 | 0 |
| 0 | 0 | 0 | 1 |

Device #1 Drives

| | Device #1 | | | | Device #2 | | | | Device #3 | | | |
|---|---|---|---|---|---|---|---|---|---|---|---|---|
| | A | C | D | F | A | B | D | E | B | C | D | G |
| Receiver | 0 | 0 | 0 | 0 | 1 | 0 | 1 | 0 | 0 | 1 | 1 | 0 |
| Enable | 1 | 1 | 1 | 0 | 0 | 1 | 0 | 0 | 1 | 0 | 0 | 0 |

Device #2 Drives

| | Device #1 | | | | Device #2 | | | | Device #3 | | | |
|---|---|---|---|---|---|---|---|---|---|---|---|---|
| | A | C | D | F | A | B | D | E | B | C | D | G |
| Receiver | 1 | 0 | 1 | 0 | 0 | 0 | 0 | 0 | 1 | 0 | 1 | 0 |
| Enable | 0 | 1 | 0 | 0 | 1 | 1 | 1 | 0 | 0 | 1 | 0 | 0 |

Device #3 Drives

| | Device #1 | | | | Device #2 | | | | Device #3 | | | |
|---|---|---|---|---|---|---|---|---|---|---|---|---|
| | A | C | D | F | A | B | D | E | B | C | D | G |
| Receiver | 0 | 1 | 1 | 0 | 0 | 1 | 1 | 0 | 0 | 0 | 0 | 0 |
| Enable | 1 | 0 | 0 | 0 | 1 | 0 | 0 | 0 | 1 | 1 | 1 | 0 |

FIG. 13

Device #1 Drives

| | Device #1 | | | | Device #2 | | | | Device #3 | | | |
|---|---|---|---|---|---|---|---|---|---|---|---|---|
| | A | C | D | F | A | B | D | E | B | C | D | G |
| Receiver | 0 | 0 | 0 | 0 | 1 | 0 | 1 | 0 | 0 | 1 | 1 | 0 |
| Enable | 0 | 0 | 0 | 1 | 1 | 0 | 1 | 1 | 0 | 1 | 1 | 1 |

Device #2 Drives

| | Device #1 | | | | Device #2 | | | | Device #3 | | | |
|---|---|---|---|---|---|---|---|---|---|---|---|---|
| | A | C | D | F | A | B | D | E | B | C | D | G |
| Receiver | 1 | 0 | 1 | 0 | 0 | 0 | 0 | 0 | 1 | 0 | 1 | 0 |
| Enable | 1 | 0 | 1 | 1 | 0 | 0 | 0 | 1 | 1 | 0 | 1 | 1 |

Device #3 Drives

| | Device #1 | | | | Device #2 | | | | Device #3 | | | |
|---|---|---|---|---|---|---|---|---|---|---|---|---|
| | A | C | D | F | A | B | D | E | B | C | D | G |
| Receiver | 0 | 1 | 1 | 0 | 0 | 1 | 1 | 0 | 0 | 0 | 0 | 0 |
| Enable | 0 | 1 | 1 | 1 | 0 | 1 | 1 | 1 | 0 | 0 | 0 | 1 |

FIG. 14

APPARATUS AND METHOD FOR TESTING INTERCONNECTIONS BETWEEN SEMICONDUCTOR DEVICES

BACKGROUND OF THE INVENTION

1. Technical Field

This invention generally relates to the testing of semiconductor devices, and more specifically relates to an apparatus and method for testing interconnections between semiconductor devices.

2. Background Art

The proliferation of modern electronics into our everyday life is due in large part to the existence, functionality and relatively low cost of advanced semiconductor devices. As technology moves ahead, the sophistication of electronic systems increases. An important aspect of manufacturing an advanced electronic system is the ability to thoroughly test the components and subassemblies in the system. Many semiconductor manufacturers have provided various built-in self-test (BIST) circuits on-chip to help to test the functionality of individual semiconductor devices located on the chip. The testability of semiconductors was enhanced with the development of boundary-scan testing, as disclosed in IEEE Standard 1149.1 "Standard Test Access Port and Boundary Scan Architecture." Boundary scan testing allows a semiconductor device to be tested by placing shift register latches (SRLs) between functional circuitry and input/output (I/O) pins when the device is placed in test mode. Test data is typically serially scanned into the SRLs to drive certain inputs, clocks are applied, results are captured, and the resultant outputs are determined by shifting the data out of the SRLs. The serial chain of SRLs that make up the boundary scan circuitry is known as a scan chain, because test data may be shifted or "scanned" into or out of the daisy-chained boundary scan registers.

In addition to testing the circuitry on a particular semiconductor device, more recent efforts have also recognized the need to test the interconnections between semiconductor devices. One known solution that can test interconnections daisy-chains the scan chains of several semiconductor devices, and uses an external tester to drive the boundary scan registers to the desired states. This configuration allows the interconnections between chips to be tested by having one chip drive a signal on an interconnection and by monitoring whether one or more receiving chips see the signal on its input. This method succeeds in testing the interconnections between semiconductor devices, but a relatively expensive external tester must be used, and a large volume of test data and test results must be managed.

Another known configuration for testing interconnects between semiconductor devices does not use an external tester, but instead uses a special-purpose controller on the same board as the devices to scan data into the scan chain, and to read data out of the scan chain. This configuration, however, has significant drawbacks. First, a special microcontroller must be provided to perform the testing. This microcontroller must have the capability of: reading test data from a memory device; scanning the test data into the boundary scan registers of the devices to be tested; activating appropriate clocking functions to perform the tests; scanning the test data (i.e., results) from the boundary scan registers; and comparing the results with expected results.

A second problem with using an on-board test controller is that a large amount of test data is needed to thoroughly test the interconnections between devices. Not only must the scan-in patterns be stored, but the expected results of each test must also be stored to allow for comparing the actual results with the expected results. Test data is typically stored in a non-volatile memory, such as erasable programmable read-only memory (EPROM). This test configuration thus requires both a relatively intelligent controller and a relatively large memory device that are present only for test purposes.

The complexity of the test controller and size of the memory device add cost to the board. Without an apparatus and method for simplifying on-board testing of interconnections between semiconductor devices, either boards will not be efficiently tested, or the expense and complexity of the test configuration will be excessive.

DISCLOSURE OF INVENTION

According to the present invention, a boundary scan register allows for simplified testing of interconnections between integrated circuits. The interconnections between integrated circuits are characterized according to net type. Each net type has one or more mask registers that drive control inputs to each boundary scan cell that drives a net of that type. One integrated circuit is configured to drive, while the others are configured to receive. The boundary scan registers are initialized to predetermined values, the mask registers are loaded, and clocks are pulsed to perform the needed tests. The results are then scanned out of the boundary scan registers, and a compression circuit compresses the test results data.

The foregoing and other features and advantages of the invention will be apparent from the following more particular description of preferred embodiments of the invention, as illustrated in the accompanying drawings.

BRIEF DESCRIPTION OF DRAWINGS

The preferred embodiments of the present invention will hereinafter be described in conjunction with the appended drawings, where like designations denote like elements, and.

BEST MODE FOR CARRYING OUT THE INVENTION

Figure 1:
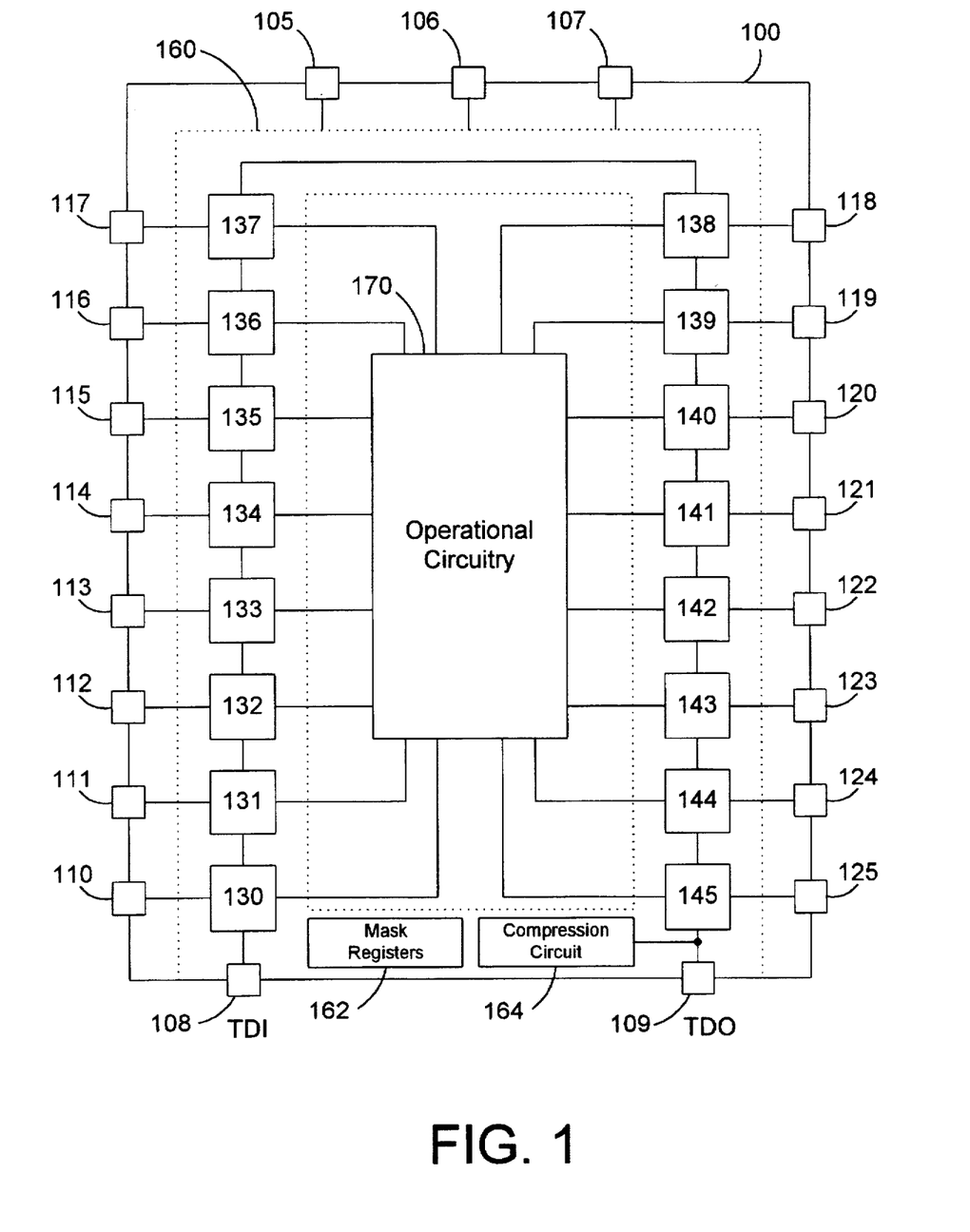
FIG. 1 is a block diagram of an on-chip test configuration in accordance with the present invention that supports interconnect testing.

An improved boundary scan circuit in accordance with the present invention allows the testing of interconnects without using a complex microcontroller and without the need of storing large and complex test patterns and expected results. Referring to FIG. 1, a semiconductor device 100 in accordance with the present invention includes operational circuitry 170, a plurality of input/output (I/O) pins (e.g., 105–125), a plurality of boundary scan cells (e.g., 130–145), mask registers 162, and a compression circuit 164. Operational circuitry 170 is the circuitry that is active during normal operation of device 100. In a normal mode of operation, operational circuitry 170 is coupled to I/O pins 110–125. Only in test mode do boundary scan cells 130–145 become active.

All of the boundary scan cells 130–145, mask registers 162, and compression circuit 164 collectively comprise a boundary scan test circuit 160. In test mode, boundary scan cells 130–145 interrupt the signals from operational circuitry 170 that normally pass through to I/O pins 110–125. Boundary scan cells 130–145 include shift-register-latches (SRLs) that allow test data to be shifted into the test data in (TDI) input (pin 108), and that allow test results to be shifted out on the test data out (TDO) output (pin 109). In addition to SRLs that are well known in the art, boundary scan cells 130–145 also include additional logic to reduce the burden of testing interconnects between device 100 and one or more other devices. Both mask registers 162 and compression circuit 164 operate in conjunction with boundary scan cells 130–145 to simplify interconnect testing.

Figure 2:
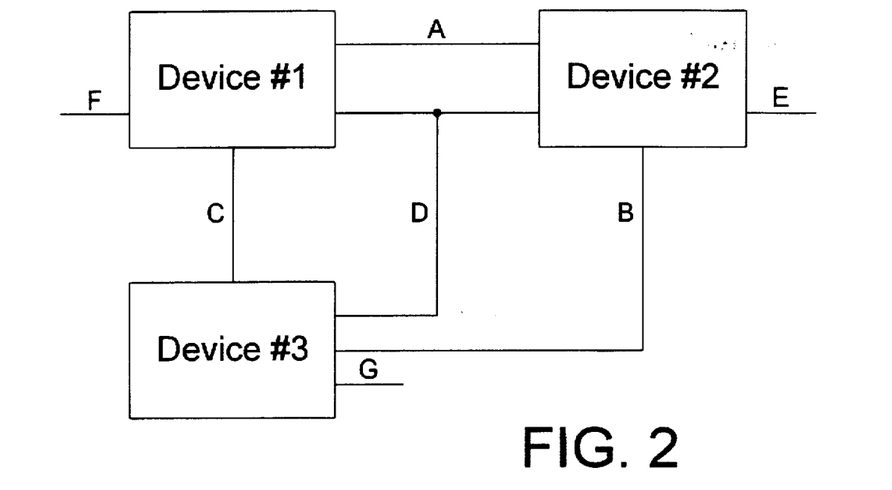
FIG. 2 is a block diagram of the different types of interconnections that may exist between three semiconductor devices on the same board.

The present invention achieves significant advantages over the prior art by grouping interconnections between devices (or chips) into types. For a two chip system, there are at most two types of nets interconnecting the chips: 1) a net interconnecting the two, and 2) a net connecting to only one of the two. For a system with n chips, there are at most $2^{(n-1)}$ net types leaving each chip. Thus, for a system with 3 chips, there are at most four net types leaving each chip. Referring to FIG. 2, a three-chip system is illustrated for purposes of illustrating the concepts of the present invention. The nets A–G represent all the net types possible in this three-chip system. While seven different net types may exist in this three-chip system, only four net types leave each chip. Device #1 has net types A, C, D and F Device #2 has net types A, B, D and E. Device #3 has net types B, C, D, and G. Note that chips in larger systems will not approach the $2^{(n-1)}$ limit because I/O count and functional use will naturally limit the number of net types.

The groupings A–G in FIG. 2 denote net types, not specific nets. Thus, a system may have a large or small number of connections (or none) for each net type. The net types discussed herein (i.e., A–G) are bidirectional signals that may be driven by any device on the net. However, one skilled in the art will recognize that unidirectional nets may also be tested in accordance with the present invention. The invention herein extends to any grouping of net types, whether by net topology, signal direction, or other attribute or combination of attributes.

Figure 3:
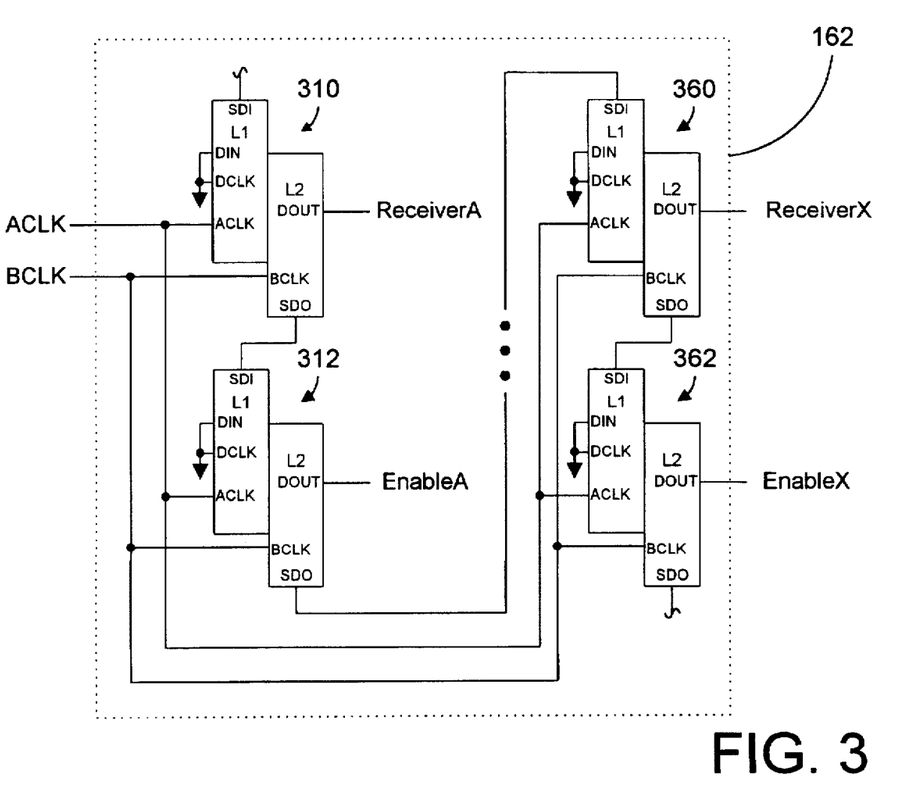
FIG. 3 is a schematic view of the mask registers shown in FIG. 1.

Grouping the interconnections by net type allow mask registers 162 to control all nets of a given type at the same time. Referring to FIG. 3, an example of a suitable configuration for mask registers 162 includes a set of SRLs (e.g., 310 and 312) for each group (i.e., net type) arranged in a scan chain. The first SRL 310 provides a Receiver output, and the second SRL 312 provides an Enable output. The Receiver output for nets of group A is called ReceiverA, and the Enable output is called EnableA. In similar fashion, the receiver and enable outputs for each group may be labeled with a suffix letter corresponding to their respective groups. As will be described in more detail below, the Receiver and Enable outputs of mask registers 162 allow nets of the same type to be simultaneously tested.

The mask registers 162 are loaded by serially shifting mask data into the scan chain of the SRLs or by a parallel load operation. The mask registers 162 are in a scan chain that is separate from the scan chain for boundary scan cells 130–145 (FIG. 1). The specific implementation shown in FIG. 3 illustrates that a Receiver Mask SRL (e.g., 310) for a particular group is followed by the Enable Mask SRL (e.g., 312) for that same group. However, it will be clear to one skilled in the art that all Receiver Mask SRLs could be grouped together, followed by all Enable Mask SRLs. In addition, one or more of the SRLs that comprise mask registers 162 may be in a different scan chain than the other SRLs. For example, the Receiver Mask SRLs could have a separate scan chain than the Enable Mask SRLs, allowing the Receiver Mask SRLs to be loaded independently from the Enable Mask SRLs. Whatever the specific configuration, the SRLs that comprise mask registers 162 may be loaded with mask data independently from the loading of test data into boundary scan cells 130–145. Referring again to FIG. 1, a single pin for test data in (TDI) 108 serves as input to all scan chains on device 100, and a single pin for test data out (TDO) 109 serves as output to all scan chains on device 100, as is well known in the art. Control pins (e.g., 105–107) are provided to select which scan chain is currently being loaded, and to otherwise control operation of boundary scan test circuit 160. These control inputs could also be provided via an on-chip controller, for example, the IEEE 1149.1 standard TAP circuit.

Figure 4:
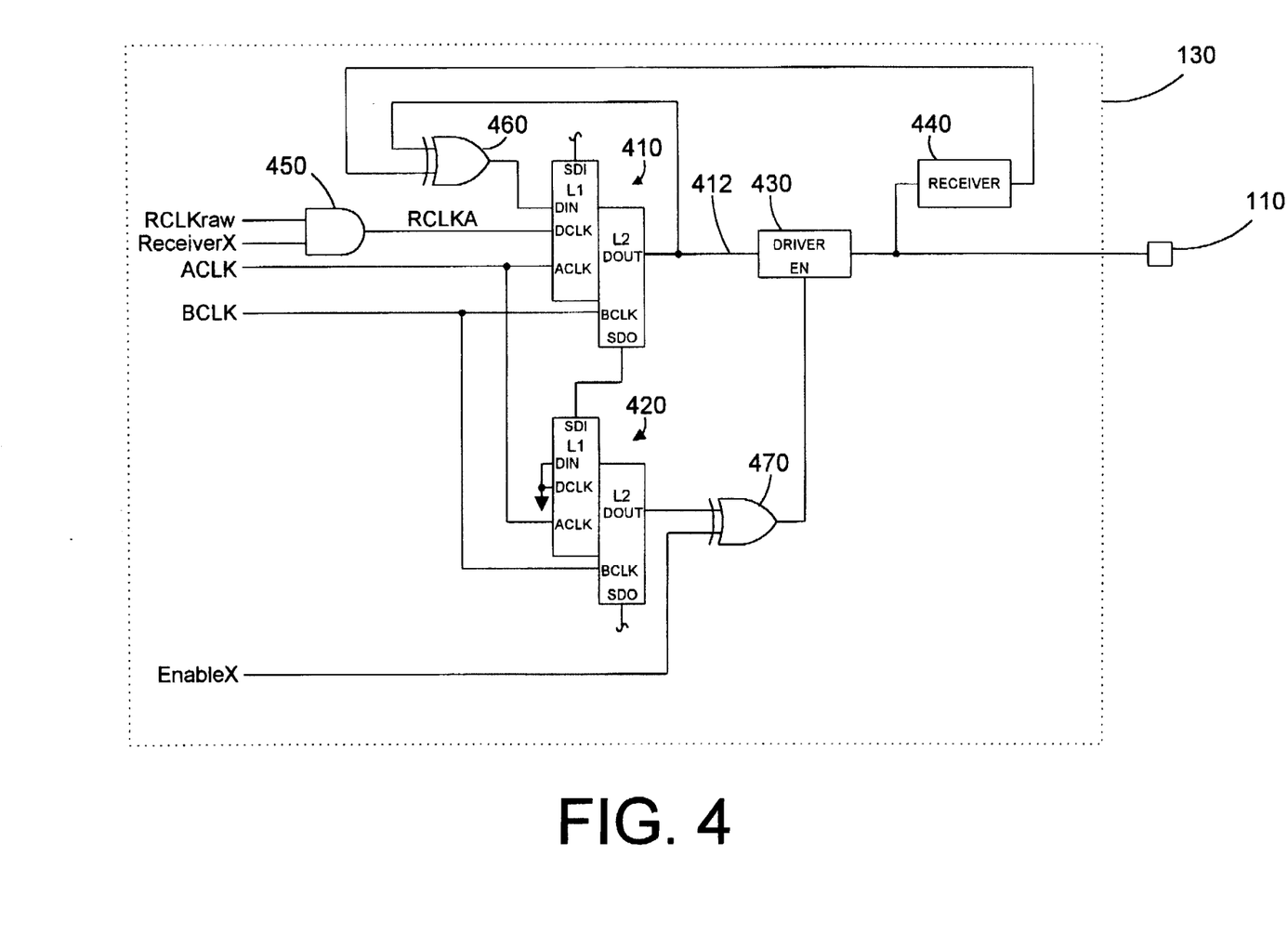
FIG. 4 is a schematic view of a suitable boundary scan cell that supports interconnect testing in accordance with the present invention.

Referring now to FIG. 4, a suitable configuration for a boundary scan cell 130 includes a data latch pair (SRL) 410, an enable latch pair (SRL) 420, a driver 430, a receiver 440, an AND gate 450, and XOR gates 460 and 470. Latches 410 and 420 contain test data that is shifted into device 100 via a test data scan chain. A clock signal ACLK is provided to latch data present at the SDI input into the L1 latch. A second clock signal BCLK is provided to latch data present on L1 to the L2 output. A data clock signal DCLK is also provided to clock in the data input DIN upon the appropriate edge of DCLK. Control inputs ReceiverX and EnableX are signals driven from mask registers 162, and the specific signals within mask registers 162 depend on the type of net that the boundary scan cell is connected to. For example, if I/O pin 110 of FIG. 4 is coupled to a net of type D (see FIG. 2), the appropriate control signals would be ReceiverD and EnableD. In this manner, each boundary scan cell receives control inputs from mask registers 162 that correspond to the type of net the cell is connected to. With this configuration, all boundary scan cells that are coupled to type A nets are controlled by the ReceiverA and EnableA outputs of mask register 162; all cells coupled to type B nets are controlled by the ReceiverB and EnableB outputs of mask register 162; and so on. The signals ReceiverX and EnableX shown in FIGS. 3 and 4 denote that the X is a variable, and is replaced with the letter of the applicable net type that boundary scan cell is connected to.

While the figures and discussion herein specifically show the use of SRLs for data latch 410 and enable latch 420, it will be appreciated by one of ordinary skill that other pre-loadable register types may be substituted for data latch within the scope of the present invention. The operation of boundary scan cell 130 is explained in more detail below.

Figure 5:
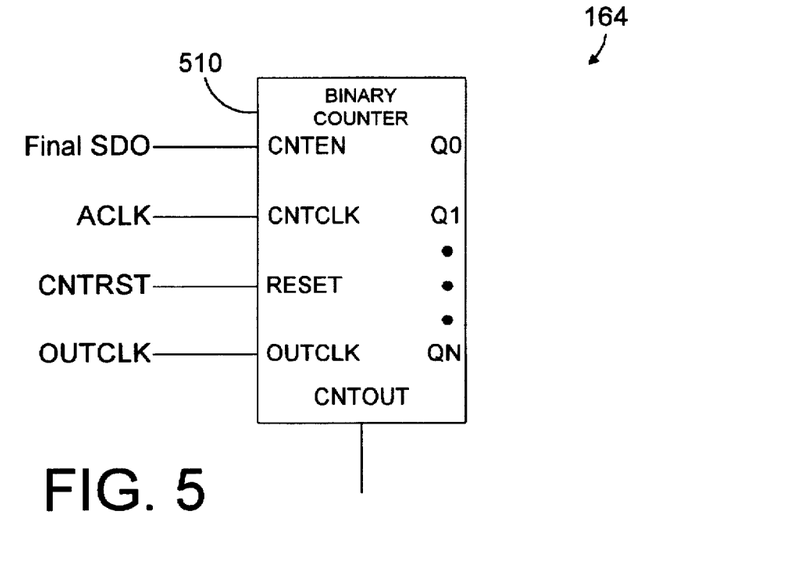
FIG. 5 is a schematic view of a one's counter that may be used to compress test results in accordance with the present invention.

Referring to FIG. 5, one suitable compression circuit 164 is a ones counter. A ones counter may be made from a binary counter 510 with a number of bits N sufficient to count the maximum number of ones expected in test results data that will be shifted out from boundary scan cells 130–145. Counter 510 has a count enable input CNTEN that is driven by the SDO line from the last boundary scan cell in the scan chain (i.e., cell 145 in FIG. 1). This input enables counter 510 to count when a one is present on SDO, and inhibits counting when a zero is present on SDO. The counter clock CNTCLK is the ACLK signal, assuring that shifting of data on SDO occurs on one clock and that counting occurs on a different clock to satisfy data setup and hold time requirements of counter 510. A counter reset input RESET is driven by a counter reset signal CNTRST, which is driven to clear counter 510 to zero. Counter 510 has a serial output CNTOUT and an output clock OUTCLK that are used to read the count from counter 510. OUTCLK may be driven by any suitable signal, including the signal used to shift data into and out of boundary scan cells 130–145. The count could also be read directly from outputs Q0–QN.

A ones counter such as counter 510 of FIG. 5 achieves compression of test results by reducing the information in a large number of bits to a smaller number of bits contained in counter 510. For example, assuming a scan chain of 250 boundary scan cells, an eight bit counter (capable of counting to 256) could be used to compress the test results. Note that a smaller counter could also be used, so long as the number of ones anticipated on the output did not exceed the maximum count capability of the counter. Prior art approaches require comparing expected test results (250 bits) with actual test results (250 bits). Compression circuit 164, however, allows compressing the information in the 250 bits of results data into eight counter bits, and likewise compresses the expected results to an eight bit representation of the number of ones in the 250 bit expected test results. Thus, by using compression circuit 164, the amount of memory required to store expected test results and the overhead in performing the comparison are greatly reduced. Note that other compression circuits such as Linear Feedback Shift Registers (LFSRs) or Linear Cellular Finite Automata based circuits could be used in place of the ones counter.

Figure 6:
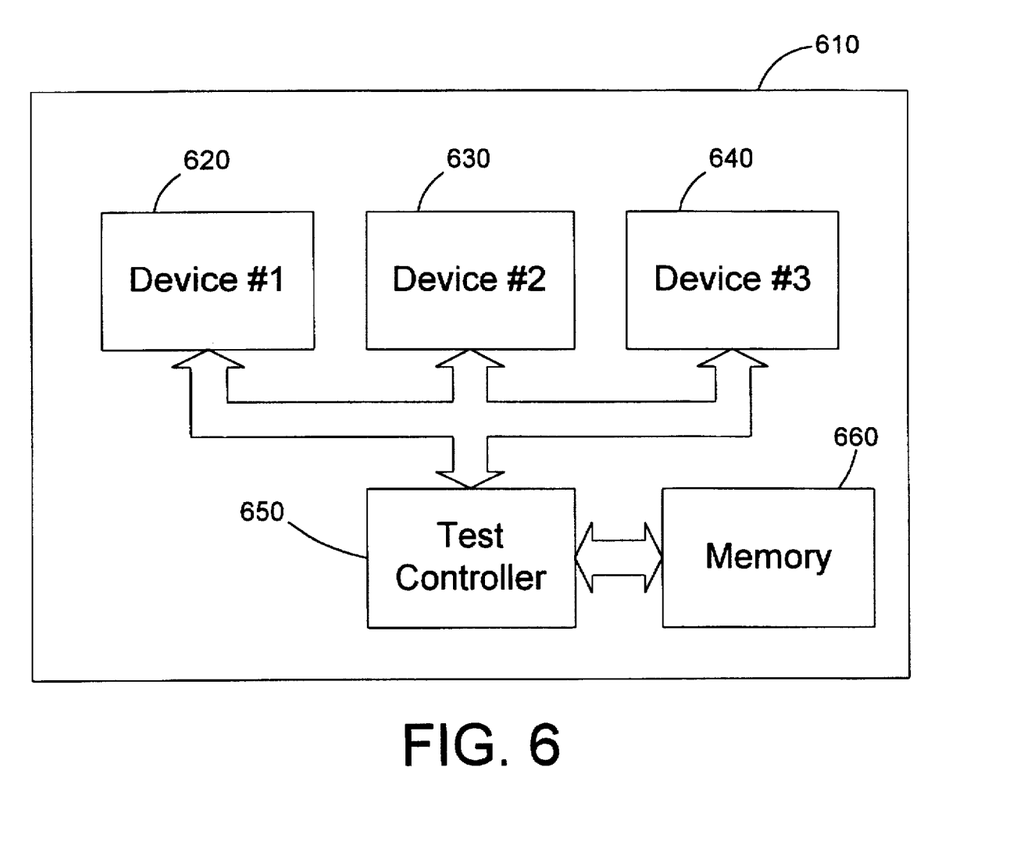
FIG. 6 is a block diagram of a board including three semiconductor devices, a test controller, and memory.

By providing the circuitry discussed above on a semiconductor device 100, simplified testing of interconnects between multiple devices 100 is now possible. Referring to FIG. 6, an electronic assembly (e.g., a circuit board 610) is provided with three semiconductor devices 620, 630, and 640, a test controller 650, and a memory 660. Semiconductor devices 620, 630 and 640 have circuitry that support a test configuration similar to device 100 of FIG. 1, but may have operational circuitry 170 that differs one from another. However, each includes a plurality of boundary scan cells, mask registers, and a compression circuit. Test controller 650 is a simple controller used to perform the shifting, clocking, and comparing functions that are needed to test the interconnects between devices 620, 630 and 640. Memory 660 is a relatively small memory that stores mask register values and bit patterns that represent expected compressed test results. Memory 660 does not need to store large test data patterns and large expected results patterns.

Test controller 650 may be any suitable controller or digital circuit that can perform the following functions:

1) initialize the boundary scan cells of each individual device to either zero or one, independent of the other devices. This could be accomplished via scan or flush operations.
2) load the appropriate mask values from memory 660 into mask registers 162; and
3) walk a one or zero through the boundary scan chain of each device.

Test controller 650 could also perform additional functions, including scanning out test results from compression circuit 164, and comparing test results from compression circuit 164 to expected values stored in memory 660. In the alternative, an external tester could be configured to perform the scan out and comparison functions. In either case, the simplified test controller 650 and compressed test data result in much lower overhead in testing interconnects on board 610. Note that test controller 650 could reside on one of the devices (e.g., devices 620, 630 and 640 of FIG. 6), or could be distributed among all the devices on board 610.

The remainder of this specification describes how interconnects in a three-chip system such as that in FIG. 6 may be tested in accordance with the present invention. The details of operation may best be understood with reference to the boundary scan cell 130 of FIG. 4. One test that can be performed is a stuck net test. A stuck net test typically has two different parts, one that drives zeroes, and one that drives ones. If a net is stuck at a high level, driving zeroes will detect the stuck net. If a net is stuck at a low level, driving ones will detect the stuck net. If a net is open, one of the above tests will detect it.

Figure 7:
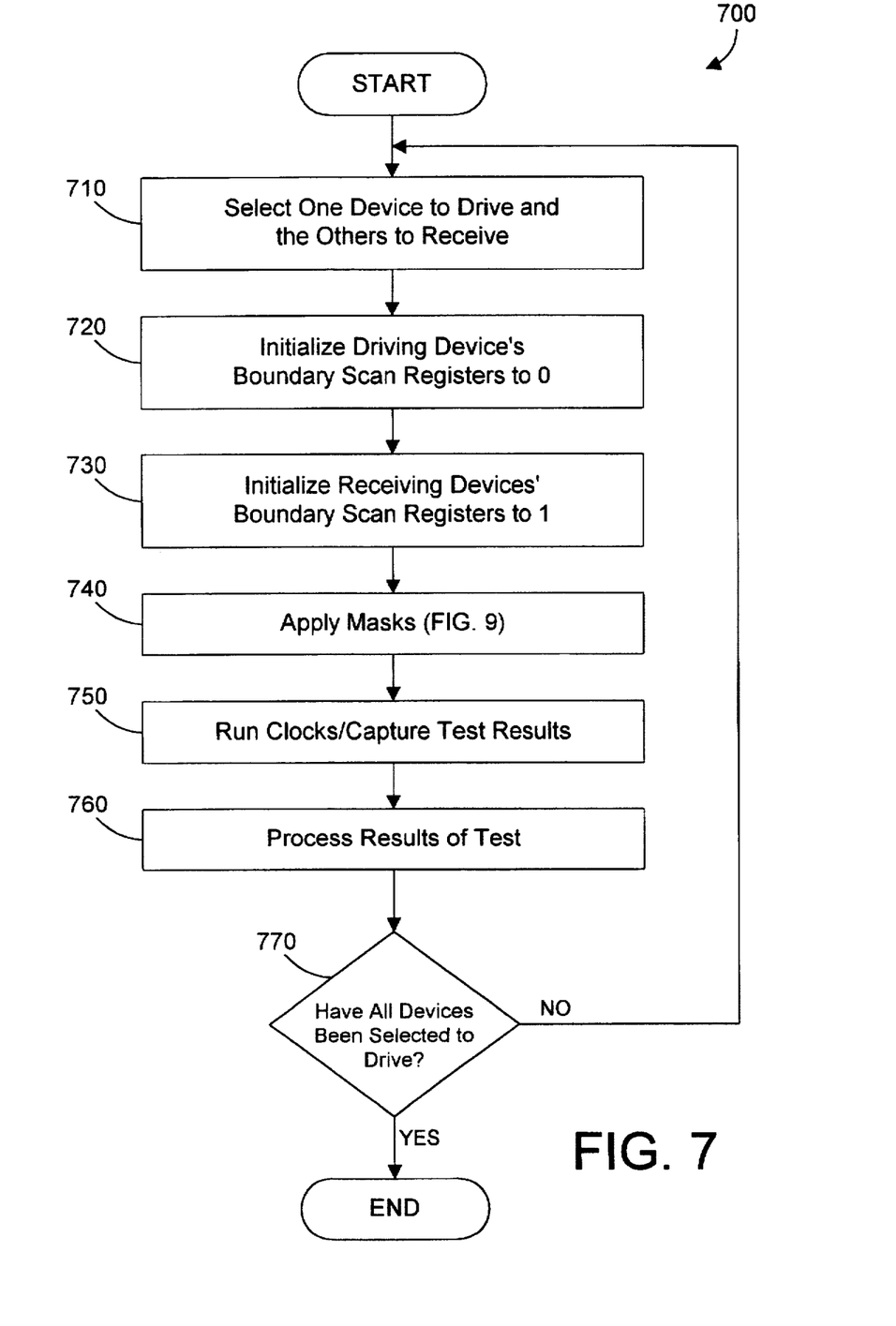
FIG. 7 is a flow diagram of the steps performed in a stuck net test driving zeroes.
Figure 9:
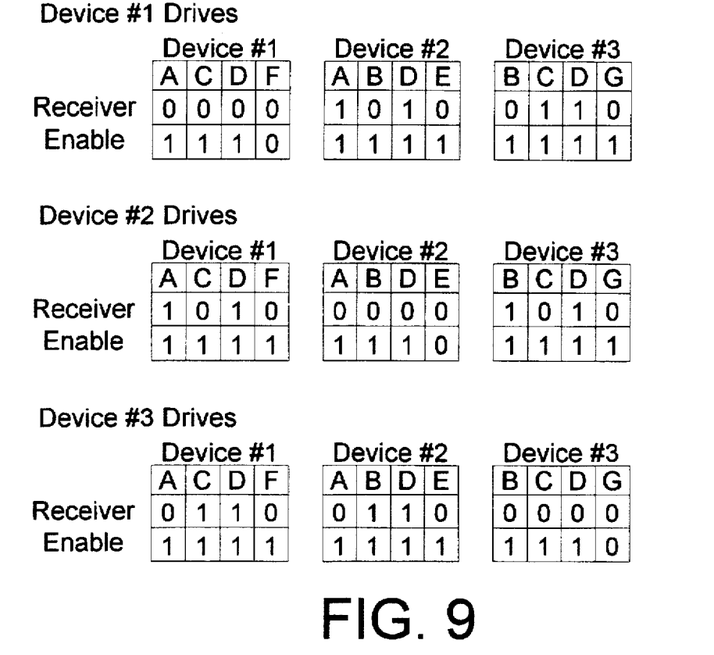
FIG. 9 is a diagram showing the masks that are applied during the stuck net test of FIG. 7.

Referring to FIG. 7, a method 700 for performing a stuck net test driving zeroes will detect if any of the interconnections between chips (i.e., nets) are shorted to power (i.e., stuck high). Method 700 begins by selecting one device to drive while the other devices receive (step 710). We assume that initially device #1 is selected to drive. The boundary scan registers in the driving device (i.e., device #1) are then initialized to zero (step 720), while the boundary scan registers in the receiving devices (i.e., devices #2 and #3) are initialized to one (step 730). With device #1 selected as the driving device, the masks in the top group of FIG. 9 are loaded into mask registers 162 (step 740). Referring back to FIG. 4, and assuming this cell is within device #1 and is coupled to a type A net, the L1 and L2 output lines DOUT will both be set to zero due to the initialization of zeroes (step 720). From the masks in FIG. 9, ReceiverA is set to zero and EnableA is set to 1. The zero on ReceiverA (i.e., ReceiverX of FIG. 4) drives the output of AND gate 450 low, thereby inhibiting the data clock DCLK on data latch 410. Thus, the data that was loaded during the initialization, a zero, will be held in latch 410 and driven on the data out line 412 to the input of driver 430. The output DOUT of the enable latch 420 is a zero (from the initialization), while the EnableA line is a one (from mask registers 162). Thus, the output of XOR gate 470 is a one, which enables driver 430 to drive its output to pin 110. In this manner device #1 drives zeroes to all nets of type A and all other groups driven from device #1 (i.e., C and D) simultaneously.

We next consider the configuration of a boundary scan cell in one of the receiving devices, device #2. The L2 output of both latches 410 and 420 are high, from the initialization to ones (step 730). With EnableA high (from the mask tables of FIG. 9), the output of XOR gate 470 is driven low, which disables driver 430. Receiver 440 transmits the signal on I/O pin 110 to the input of XOR gate 460, which in turn drives the data input of data latch 410. The output 412 of data latch 410 is a one (from the initialization step 730), the data driven on I/O pin by device #1 is a zero (from the initialization in step 720), so the output of XOR gate 460 is high. If the net is stuck high, receiver 440 drives a high signal to XOR gate 460, driving its output low. From the masks in FIG. 9, the ReceiverA signal is set to one. This allows AND gate 450 to transmit the RCLK signal to the DCLK input of latch 410. Thus, latch 410 captures the data present in input DIN, and the data on data latch 410 will indicate whether or not the net is stuck high.

The next step is to run the appropriate clocks for the tests (step 750). First, the receiver clock RCLKraw is driven for one or more clock pulses. Those boundary scan cells that are configured to receive (i.e., that have ReceiverX high) will load data from their DIN inputs when RCLKraw is driven. BCLK is then pulsed to copy the data from the L1 latches to the L2 latches. As described above, the data loaded on data latch 410 reflects whether the net is stuck high (data=0) or not (data=1). The masks are configured so that only those boundary scan cells that connect to nets driven from device #1 will be allowed to receive data on their DIN inputs. On device #2 nets in groups B and E are not allowed to receive, and on device #3 nets in groups B and G are not allowed to receive. This prevents the indeterminate value of undriven nets from being captured in the boundary scan register, thus eliminating unpredictable results from being considered.

Once the clocks for the tests have been run, the test results are processed (step 760). The processing of test results in accordance with the preferred embodiment includes compressing results in the compression circuit 164 of FIG. 1, scanning the test results out of the boundary scan chain and comparing the compressed results to expected results. In the alternative, the processing of the test results (step 760) may be performed automatically by boundary scan cell 130 or other circuitry, either on-chip or external, which compresses or otherwise processes the test data. Another alternative would leave the test results in the boundary scan registers of the receiving chips in place of the initialization of zeroes (step 830) of the subsequent stuck zeroes test.

If all devices have been selected to drive (step 770=YES), the stuck net test driving zeroes is complete. If not (step 770=NO), a different device is selected as the driving device, and method 700 is repeated.

Figure 8:
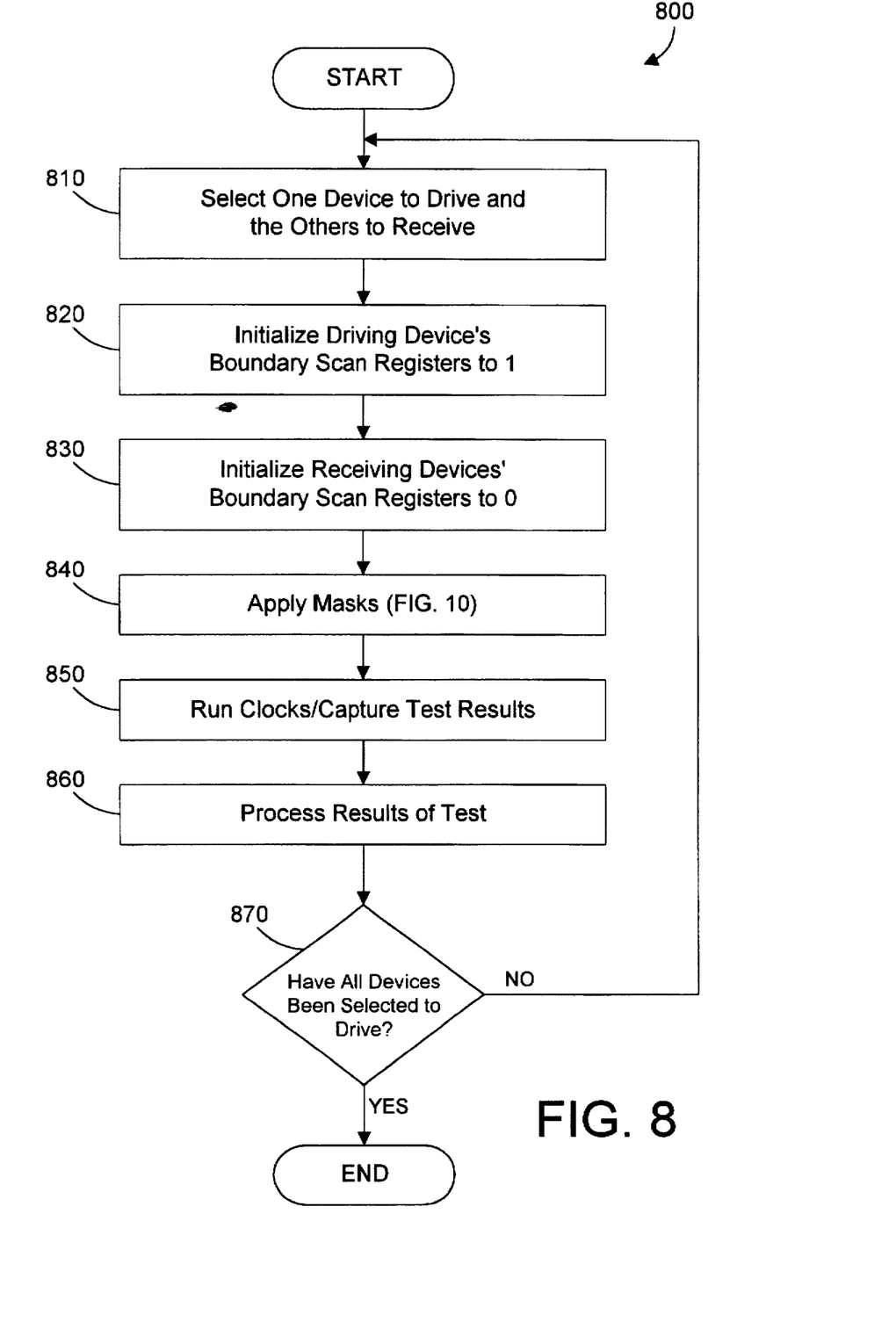
FIG. 8 is a flow diagram of the steps performed in a stuck net test driving ones.
Figure 10:
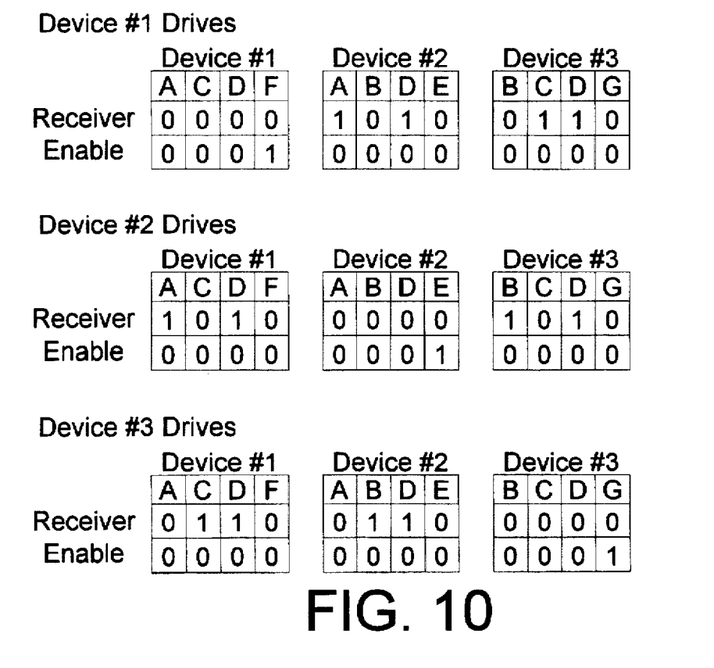
FIG. 10 is a diagram showing the masks that are applied during the stuck net test of FIG. 8.

Referring to FIG. 8, a method 800 for performing a stuck net test driving ones will detect if any net is shorted to ground. The steps are similar to the steps in the stuck net test driving zeroes, except the boundary scan registers of the driving device are initialized to ones (step 820) and the boundary scan registers of the receiving devices are initialized to zeroes (step 830). The receiver masks from FIG. 10 are applied (step 840), the clocks are run in the same manner (step 850), and the results may be suitably processed as needed (step 860). Note that the enable masks for the stuck net test driving ones are the bitwise complement of the enable masks for the stuck net test driving zeroes. The complementary enable masks are required to allow XOR 470 the same outputs as in the stuck ones test (high or driving chips and low on receiving chips). If stuck ones results are left in place of initialization step 830 as described above, the same enable masks that were used in the stuck net test driving zeroes can be used for the stuck net test driving ones.

While methods 700 and 800 are shown herein as separate tests for purposes of illustration, these tests may be combined or interleaved within the scope of the present invention. For example, device #1 may perform a stuck net test driving zeroes, followed by a stuck net test driving ones before selecting device #2 as the driving device. Any order or combination of stuck net tests for different driving devices is within the scope of the present invention.

Figure 11:
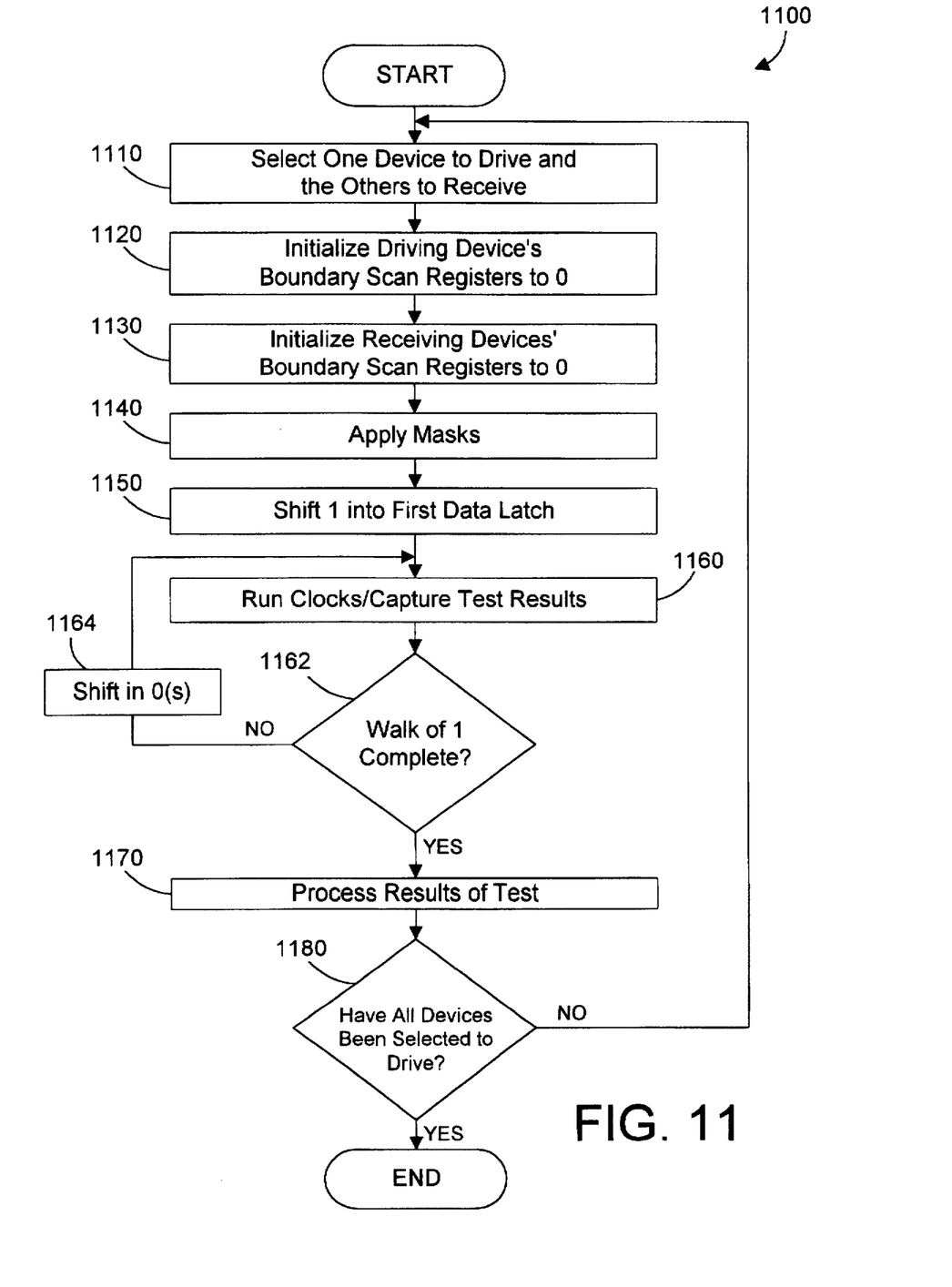
FIG. 11 is a flow diagram of the steps performed in a walking ones shorted net test.
Figure 13:
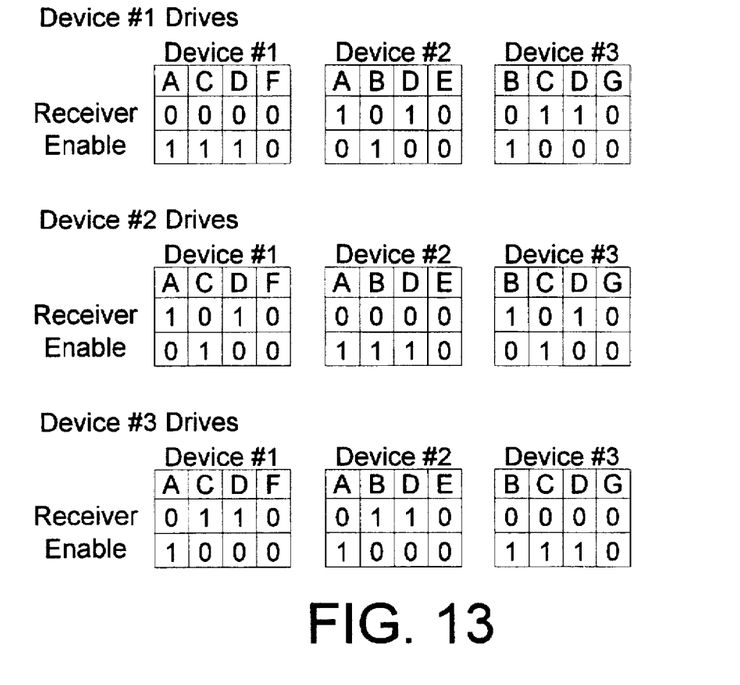
FIG. 13 is a diagram showing the masks that are applied during the shorted net test of FIG. 11.

Referring now to FIG. 11, a method 1100 for performing a walking ones shorted net test will detect if a net is shorted to another net. First, one device is selected to drive, while the others are selected to receive (step 1110). The boundary scan registers of the driving device are initialized to zeroes (step 1120), and the boundary scan registers of the receiving devices are initialized to zeroes (step 1130). The masks shown in FIG. 13 are then loaded into mask registers 162 (step 1140) according to which device is driving the nets. Note that nets not driven by the driving device must still be driven to zero for a complete shorted net test. Thus, the Enable mask for GroupB (FIG. 13) is set so that both devices #2 and #3 drive net B to zero. A one is then shifted into the first data latch in the boundary scan chain (step 1150). This one will be walked through the entire scan chain while keeping all the rest of the boundary scan registers at zero. The clocks are then run for the test (step 1160). Since the walk of the one through the scan chain is not yet complete (step 1162=NO), one or more zeroes are shifted into the scan chain (step 1164), thus advancing (i.e., walking) the one to the next data latch. The clocks are run (step 1160) and zeroes are shifted in (step 1164) until the one has walked through the entire scan chain (step 1162=YES). At this point the results of the walking one test is processed (step 1170). This processing involves reading data out of boundary scan latches 130–145 or compressing the boundary register data and reading out the compressed data to determine if the results data matches the expected results. If there are devices in the system that have not yet been selected to drive (step 1180=NO), the test is repeated, until all devices have been selected to drive (step 1180=YES). While method 1100 of FIG. 11 discloses selecting each device to drive (step 1180) for purposes of illustration, one skilled in the art will recognize that a full shorted net test may be possible without each device driving each net. For example, for the system of FIG. 2, device #1 may be configured to drive net types A, C and D. Device #2 may then be selected, but since net types A and D were previously tested (with device #1 driving), only nets of type B need to be tested. When this test is complete, all nets (A, B, C, D) between devices have been tested for shorts to another net without selecting device #3 to drive. Thus, various modifications are possible within the scope of the present invention.

In a normal walking ones test with no shorted nets, each data latch (e.g., 410 of FIG. 4) in each driving device will drive a one only once during the test, and will drive a zero at all other times. Assuming only one receiving device I/O pin is connected to a particular driving device net, each receiving device will receive a one only once during the test, and will receive zeroes at all other times. XOR gate 460 provides a compression mechanism to detect if a one is driven for more than one test cycle. In normal operation (i.e., if no shorted nets exist), the output 412 of data latch 410 is low (from the initialization in step 1030). Since the driving device is driving zeroes (from step 1020), the data latched into the boundary scan cell (i.e., the output of XOR gate 460) is low, keeping the output 412 of data latch 410 low until the one is walked into a position on the driving device that drives the net coupled to cell 130. At this point, receiver 440 drives its output high, driving the output of XOR gate 460 high. When the receiver clock is pulsed as part of the test (step 1060), the high input on DIN is captured into data latch 410, driving output 412 high. With the next shift to walk the one in the driving device to its next position, the driving device will again drive a zero to receiver 440. The zero on receiver 440 and the one on output 412 keep the output of XOR gate 460 high, unless another high is seen by receiver 440, which would indicate a shorted net. In summary, data latch 410 will contain a one after the first time its net is driven high, and is reset to a zero if it is driven high a second time. If a net is driven by more than one I/O pin of a driving device, it may be driven high more than once without representing any shorted nets. The presence of XOR gate 460 compresses the data so that a one state on data latch 410 represents that there were no shorts (or an even number of shorts), while the opposite state indicates that one (or an odd number of shorts) exists. Note that if exactly two shorts to a particular net exist, XOR gate 460 would compress this information, and would indicate that no short existed. However, the compression scheme using XOR gate 460 will detect the majority of shorts anticipated in board 610. After the completion of the walk of one through all data latches in the driving device's boundary scan registers, boundary scan data is scanned out (and possibly compressed), and results are compared to expected values.

Note that a walking ones test that performs an even number of tests will detect all open and stuck nets in a single test. Thus, if an even number of boundary scan cells are provided, a normal walking ones test will detect all open and stuck nets. If an odd number of boundary scan cells are provided, the last test must be followed by an additional test where all zeroes are driven before reading test results.

The shorted net test disclosed herein will detect nets that manifest as zero dominant (a zero/one conflict always results in a zero), and net dominant (one net always wins the conflict). However, the shorted net test does not cover ones dominance (a zero/one conflict always results in a one). To cover this, a walking zeroes test can be performed.

Figure 12:
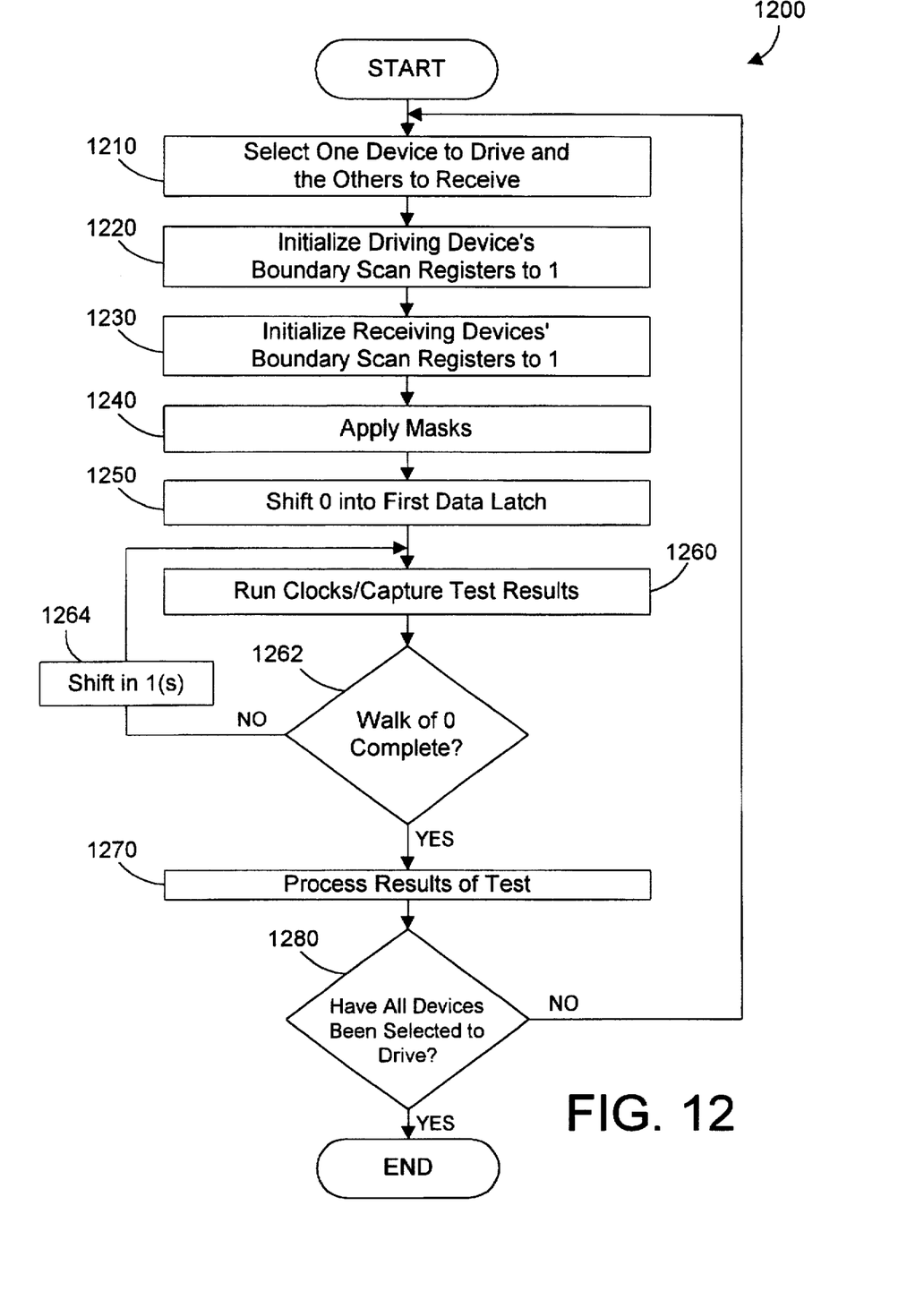
FIG. 12 is a flow diagram of the steps performed in a walking zeroes shorted net test.
Figure 14:
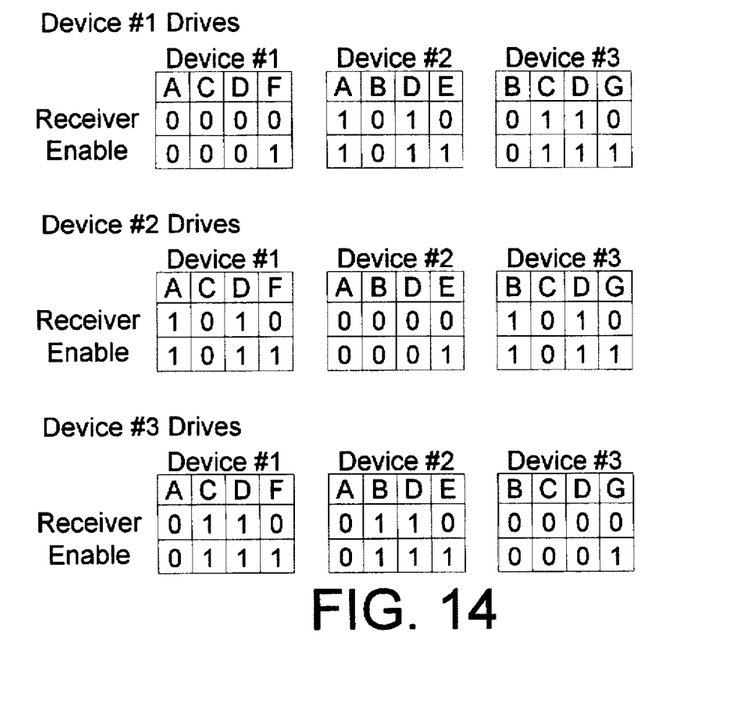
FIG. 14 is a diagram showing the masks that are applied during the shorted net test of FIG. 12.

Referring to FIG. 12, a method 1200 for performing a walking zeroes test performs similar steps to the walking ones test of FIG. 11. A device is selected to drive (step 1210), the boundary scan registers of all devices are initialized to ones (steps 1220 and 1230), and the masks of FIG. 14 are applied (step 1240). A zero is then shifted into the first data latch (step 1250), and the zero is walked through the boundary scan registers of the driving device (steps 1260, 1262, 1264) until the walk of the zero is complete (step 1262=YES). The test results are suitably processed (step 1270), and if all devices have been selected to drive (step 1280=YES), or if all nets have been driven, the test is complete.

The circuit configuration disclosed in the figures requires a knowledge of system net topology in order to route the appropriate receiver and enable signals to each boundary scan cell. However, a more flexible boundary scan cell may allow a device to be used in a different system configuration by providing multiple receiver and enable masks. For example, boundary scan cell 130 of FIG. 4 could be modified such that AND gate 450 is expanded to have inputs from multiple ReceiverX group inputs, and XOR gate 470 is expanded to have inputs from multiple EnableX group inputs. Each different input could be controlled by a separate mask. In this manner, the masks corresponding to the appropriate net type of the actual system configuration will contain valid mask data, while the remaining masks will be set to non-controlling values.

The configuration of boundary scan cell 130 allows full testing of interconnects between devices without requiring a sophisticated external tester or on-board controller that must manipulate large quantities of test data. By providing on-board compression of test results and a simple controller, this testing is possible in a simple, low-cost design that significantly reduces the intelligence required of the tester.

While the invention has been particularly shown and described with reference to preferred embodiments thereof, it will be understood by those skilled in the art that various changes in form and details may be made therein without departing from the spirit and scope of the invention. For example, it will be understood that, while various of the conductors (connections) are shown in the drawing as single lines, they are not so shown in a limiting sense, and may comprise plural conductor (connections), as is understood in the art.

We claim:

1. An on-chip boundary scan cell for an integrated circuit comprising:

a data latch that is preloadable with a predetermined value, the data latch having a data input coupled to at least one of a plurality of input/output (I/O) pins on the integrated circuit;

an enable latch that is preloadable with a predetermined value;

a clock gating circuit coupled to at least one mask register for storing data on the data input when indicated by the information in the mask register;

an enable gating circuit coupled to the at least one mask register for driving the output of the data latch onto at least one of the plurality of I/O pins when indicated by the information in the at least one mask register.

2. The boundary scan cell of claim 1 wherein the data latch further comprises a serial clock input, a serial data input, a serial data output, and a data clock input, the data latch storing the state of the serial data input when the serial clock is applied, the data latch outputting its current state on the serial data output when the serial clock is applied, the data latch storing the state of the data input when the data clock input is applied.

3. The boundary scan cell of claim 1 wherein the enable latch comprises a serial clock input, a serial data input, a serial data output, and a parallel data output, the parallel data output controlling a driver coupled to at least one of the plurality of I/O pins, the enable latch storing the state of the serial data input when the serial clock is applied, the enable latch outputting its current state on the serial data output and on the parallel data output when the serial clock is applied.

4. The boundary scan cell of claim 1 wherein the at least one mask register includes a plurality of shift register latches (SRLs), the at least one mask register including a different group of SRLs for controlling different types of nets coupled to the I/O pins of the integrated circuit.

5. The boundary scan cell of claim 1 wherein the clock gating circuit includes a compression circuit for compressing the output of the data latch over a plurality of tests.

6. The boundary scan cell of claim 5 wherein the compression circuit implements a logical exclusive OR (XOR) function.

7. An integrated circuit device comprising:

a plurality of input/output (I/O) pins;

a semiconductor device including operational circuitry coupled to at least one of the plurality of I/O pins; and boundary scan test circuitry including:

at least one mask register for storing information relating to the testing of a particular net type; and a plurality of boundary scan cells interposed between the operational circuitry and the plurality of I/O pins to allow testing of interconnections between the integrated circuit device and at least one external integrated circuit, at least one of the plurality of boundary scan cells comprising:
- a data latch that is preloadable with a predetermined value, the data latch having a data input coupled to at least one of the plurality of I/O pins;
- an enable latch that is preloadable with a predetermined value;
- a clock gating circuit coupled to the at least one mask register for storing data on the data input when indicated by the information in the mask register;
- an enable gating circuit coupled to the at least one mask register for driving the output of the data latch onto at least one of the plurality of I/O pins when indicated by the information in the at least one mask register.

8. The integrated circuit device of claim 7 wherein the at least one mask register includes a plurality of shift register latches (SRLs), the at least one mask register including a different group of SRLs for controlling different types of nets coupled to the I/O pins of the integrated circuit device.

9. The integrated circuit device of claim 7 wherein the plurality of boundary scan cells form a scan chain, the integrated circuit device further comprising a compression circuit for compressing the test results stored in the scan chain.

10. The integrated circuit device of claim 9 wherein the compression circuit comprises a ones counter.

11. An electronic assembly comprising;
(A) a plurality of integrated circuit devices, each of the plurality of integrated circuit devices comprising:
- a plurality of input/output (I/O) pins;
- a semiconductor device including operational circuitry coupled to at least one of the plurality of I/O pins; and
- boundary scan test circuitry including:
  - at least one mask register for storing information relating to the testing of a particular net type; and
  - a plurality of boundary scan cells interposed between the operational circuitry and the plurality of I/O pins in a scan chain to allow testing of interconnections between the integrated circuit device and at least one external integrated circuit, at least one of the plurality of boundary scan cells comprising:
    - a data latch that is preloadable with a predetermined value, the data latch having a data input coupled to at least one of the plurality of I/O pins;
    - an enable latch that is preloadable with a predetermined value;
    - a clock gating circuit coupled to the at least one mask register for storing data on the data input when indicated by the information in the at least one mask register;
    - an enable gating circuit coupled to the at least one mask register for driving the output of the data latch onto at least one of the plurality of I/O pins when indicated by the information in the at least one mask register;
(B) a plurality of interconnections between the I/O pins of the plurality of integrated circuit devices;
(C) a controller for initializing at least one of the scan chains to ones, for initializing at least one of the scan chains to zeroes, for walking a one through at least one of the scan chains that was initialized to zero, and for walking a zero through at least one of the scan chains that was initialized to one.

12. The electronic assembly of claim 11 further comprising a memory device for storing values for the at least one mask register and for storing expected test results.

13. The electronic assembly of claim 11 wherein the boundary scan test circuitry further comprises a compression circuit for compressing the test results stored in the scan chain.

14. A method for testing the interconnections between a plurality of integrated circuit devices on an electronic assembly, the method including the steps of:
(A) providing the electronic assembly with the plurality of integrated circuit devices thereon, each integrated circuit device including a plurality of boundary scan cells arranged in a scan chain to allow testing of interconnections between the plurality of integrated circuit devices;
(B) providing the interconnections between the plurality of integrated circuit devices, each interconnection comprising a net;
(C) characterizing each net on the circuit board as of a particular net type;
(D) providing at least one mask register for storing information relating to the testing of a particular net type;
(E) designating one of the plurality of integrated circuit devices as the driving device;
(F) designating each of the integrated circuit devices not designated as the driving device as a receiving device;
(G) initializing the scan chain of the driving device to a predetermined logical state;
(H) initializing the scan chain of each receiving device to a predetermined logical state;
(I) loading the at least one mask register with a mask suitable for a particular test; and
(J) applying at least one clock signal to the boundary scan cells to perform the particular test.

15. The method of claim 14 further including the step of:
repeating steps (E) through (J) until each of the integrated circuit devices has been selected as the driving device.

16. The method of claim 14 wherein step (G) initializes the scan chain of the driving device to zero, and wherein the method further comprises the step of:
walking a one through the scan chain of the driving device to detect whether any of the nets are shorted to any other net.

17. The method of claim 14 wherein step (G) initializes the scan chain of the driving device to one, and wherein the method further comprises the step of:
walking a zero through the scan chain of the driving device to detect whether any of the nets are shorted to any other net.

18. The method of claim 14 wherein step (G) initializes the scan chain of the driving device to zero and wherein step (H) initializes the scan chain of each receiving device to one in order to perform a test to determine whether any of the nets are stuck high.

19. The method of claim 14 wherein step (G) initializes the scan chain of the driving device to one and wherein step (H) initializes the scan chain of each receiving device to zero in order to perform a test to determine whether any of the nets are stuck low.

20. A method for testing the interconnections between a plurality of integrated circuit devices on a circuit board, the method including the steps of:
(A) providing the circuit board with the plurality of integrated circuit devices thereon, each integrated circuit device including:

(i) a plurality of input/output (I/O) pins;

(ii) a semiconductor device including operational circuitry coupled to at least one of the plurality of I/O pins;

(iii) at least one mask register for storing information relating to the testing of a particular net type;

(iv) a plurality of boundary scan cells interposed between the operational circuitry and the plurality of I/O pins in a scan chain to allow testing of interconnections between the plurality of integrated circuit devices, the boundary scan cell comprising:

(a) a data latch that is preloadable with a predetermined value, the data latch having a data input coupled to at least one of the plurality of I/O pins;

(b) an enable latch that is preloadable with a predetermined value;

(c) a clock gating circuit coupled to the at least one mask register for storing data on the data input when indicated by the information in the at least one mask register;

(d) an enable gating circuit coupled to the at least one mask register for driving the output of the data latch onto at least one of the plurality of I/O pins on the integrated circuit when indicated by the information in the at least one mask register; and (e) a compression circuit for compressing the data input over a plurality of tests;

(v) a compression circuit for compressing test results stored in the scan chain;

(B) providing the interconnections between the plurality of integrated circuit devices, each interconnection comprising a net;

(C) characterizing each net on the circuit board as of a particular net type;

(D) providing at least one mask register for storing information relating to the testing of a particular net type;

(E) designating one of the plurality of integrated circuit devices as the driving device;

(F) designating each of the integrated circuit devices not designated as the driving device as a receiving device;

(G) initializing the scan chain of the driving device to a predetermined logical state;

(H) initializing the scan chain of each receiving device to a predetermined logical state;

(I) loading the at least one mask register with a mask suitable for a particular test; and (J) applying at least one clock signal to the boundary scan cells to perform the particular test.

21. The method of claim 20 further including the step of:

repeating steps (E) through (J) until each of the integrated circuit devices has been selected as the driving device.

22. The method of claim 20 further including the steps of:

scanning out test results data from the scan chains of the integrated circuit devices; and comparing the test results data to expected test results.

\* \* \* \* \*

UNITED STATES PATENT AND TRADEMARK OFFICE
CERTIFICATE OF CORRECTION

PATENT NO.   : 5,717,701
DATED        : February 10, 1998
INVENTOR(S)  : Frank William Angelotti et al It is certified that error appears in the above-identified patent and that said Letters Patent is hereby corrected as shown below:

Column 1, Section 2, Line 13:  "modem" should be --modern--.

Signed and Sealed this

Nineteenth Day of May, 1998

Attest:

BRUCE LEHMAN

*Attesting Officer*     Commissioner of Patents and Trademarks